(12) United States Patent
Yang (10) Patent No.: US 6,963,231 B2
(45) Date of Patent: Nov. 8, 2005

(54) INSULATING DEVICE FOR A SYSTEM ON CHIP (SOC)

(75) Inventor: Min-Chin Yang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 31 days.

(21) Appl. No.: 10/780,820

(22) Filed: Feb. 17, 2004

(65) Prior Publication Data

US 2005/0179474 A1    Aug. 18, 2005

(51) Int. Cl.$^7$ ............................................. H03K 3/00
(52) U.S. Cl. ........................ 327/112; 327/333; 326/80
(58) Field of Search ................ 327/112, 333, 544–545; 326/62–63, 68, 80–81

(56) References Cited

U.S. PATENT DOCUMENTS 5,828,231 A * 10/1998 Bazargan ..................... 326/81
6,593,775 B2   7/2003 Yu et al. ......................... 326/80

* cited by examiner

Primary Examiner—Quan Tra
(74) Attorney, Agent, or Firm—Winston Hsu (57) ABSTRACT

An insulating device for system on chip (SOC). The SOC has a first circuit region powered by a main power source and a second circuit region powered by a real-time power source. In the insulating device, a selector designates the main power source or a battery source as a real-time power source. A level detector detects a voltage level of the main power source and outputs a resulting signal. A NAND gate produces a logic output according to the result signal and an output signal of the first circuit. The NAND gate includes first and second PMOS transistors and first and second NMOS transistors. Gates of the first PMOS transistor and the first NMOS transistor are directly connected to the output signal of the first circuit without through any buffers. Gates of the second PMOS transistor and the second NMOS transistor are directly connected to the result signal without any buffers.

10 Claims, 9 Drawing Sheets

INSULATING DEVICE FOR A SYSTEM ON CHIP (SOC)

BACKGROUND OF THE INVENTION

1. Field of the Invention

The present invention relates to an insulating device, and more particularly, to an insulating device for a system on chip (SOC) with variable power source.

2. Description of the Related Art

Figure 1A:
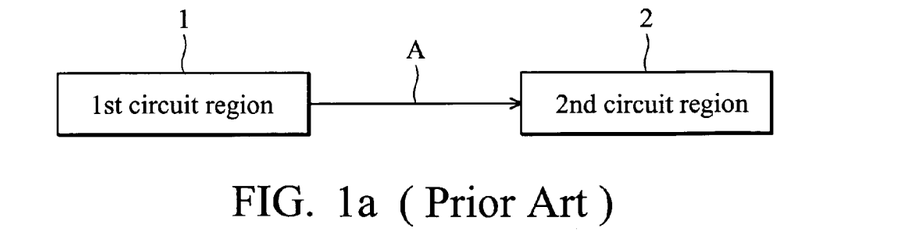
FIG. 1a shows a conventional SOC design.
Figure 1B:
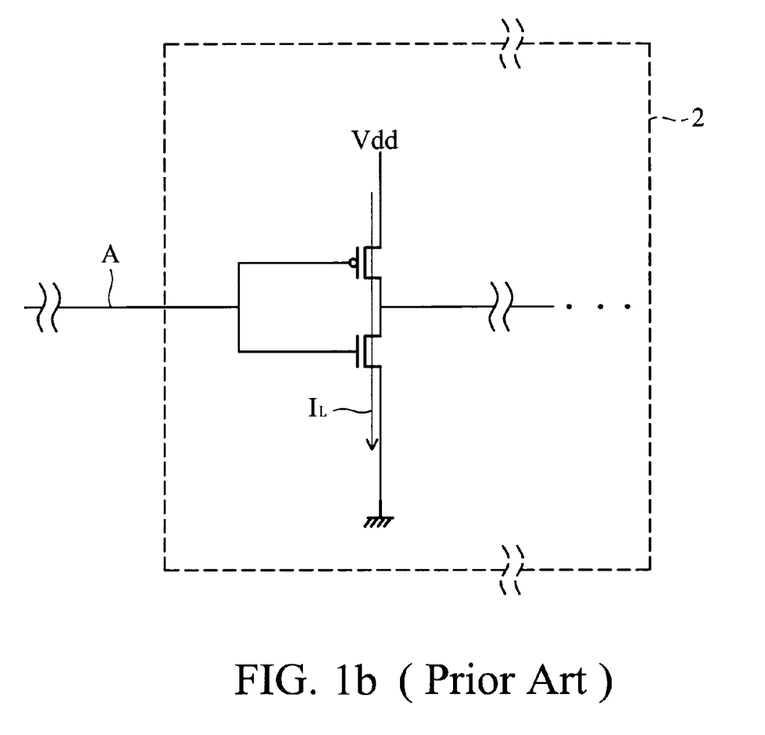
FIG. 1b is a diagram of the conventional SOC design during power-down mode.

In system on chip (SOC) designs, different operating modes are provided for efficient power utilization, for example, normal operating mode, power-down mode and the like. Thus, a power supply system provided in the SOC design, for example, can include a main source, a battery source and the like. FIG. 1a shows a conventional SOC design with variable power source. The first circuit region 1 is powered by a main source and the second circuit region 2 by a battery source. Output signals of the first circuit region 1 are connected to the second circuit region 2 directly through terminal A. In power-down mode, the main source is turned off and terminal A floated. This may cause current leakage in the second circuit 2 powered by the battery source, reducing the power utilization of the entire system, as shown in FIG. 1b.

Figure 2:
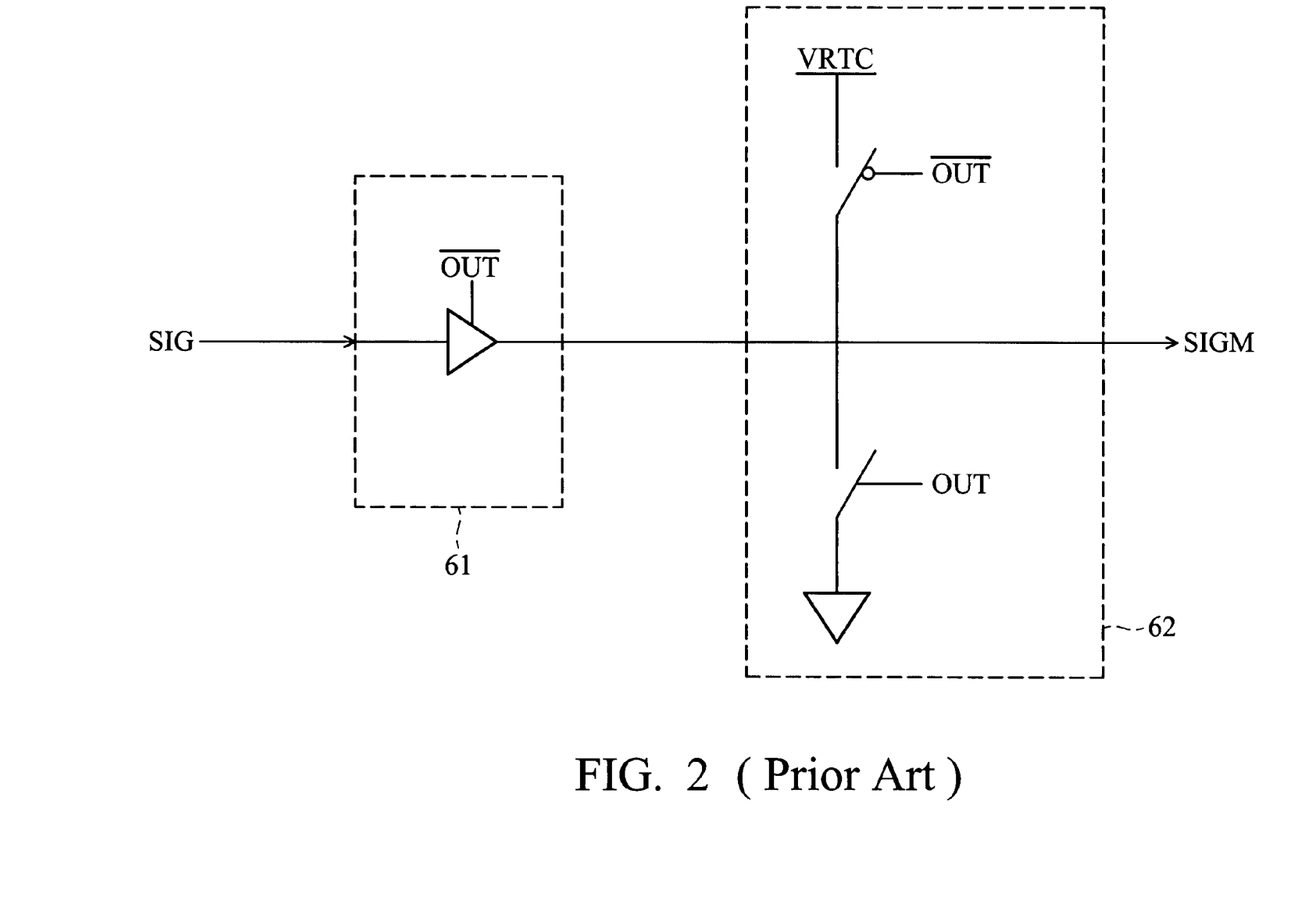
FIG. 2 shows a conventional insulator for a power supply system.

To address the above problem, an insulator for a power supply system with variable source is disclosed by Yu et al. in U.S. Pat. No. 6,593,775. In Yu, a signal isolation controller is used to change an output level of the circuit powered by VCC according to a detected level as shown in FIG. 2. As disclosed in Yu, the signal isolation controller can includes a switch 62 and a tri-state device 61, such as a tri-state buffer, a transmission gate or a latch. In SOC designs, however, utilization of tri-state devices is not conducive to timing analysis.

SUMMARY OF THE INVENTION

It is therefore an object of the present invention to provide an insulating device to prevent current leakage in systems on chip (SOC) without using tri-state devices thereby accommodating to timing analysis and improving the power utilization of the entire system.

According to the above mentioned object, the present invention provides an insulating device for systems on chip (SOC). The SOC has a first circuit region powered by a main power source and a second circuit region powered by a real-time power source. In this insulating device, a selector designates the main power source or a battery source as the real-time power source. A level detector is powered by the real-time power source to detect a voltage level of the main power source and outputs a result signal. A NAND gate is coupled to the first circuit and the level detector to produce a logic output according to the result signal and an output signal of the first circuit.

In this case, the NAND gate includes first and second PMOS transistors and first and second NMOS transistors. The first NMOS transistor has a gate coupled to the output signal of the first circuit and a source coupled to ground. The second NMOS transistor has a gate coupled to the result signal and a source coupled to the drain of the first NMOS transistor and a drain as an output terminal. The first PMOS transistor has a gate coupled to the gate of the first NMOS transistor, a source coupled to the real-time power source and a drain coupled to the drain of the second NMOS transistor. The second PMOS transistor has a gate coupled to the gate of the second NMOS transistor, a source coupled to the real-time power source and a drain coupled to the drain of the second NMOS transistor.

According to the above mentioned object, the present invention also provides another insulating device for systems on chip. In this insulating device, a selector designates the main power source or a battery source as a real-time power source. A level detector is powered by the real-time power to detect a voltage level of the main power source and outputs a result signal. A NOR gate is coupled to the first circuit and the level detector to produce a logic output according to the result signal and an output signal of the first circuit.

BRIEF DESCRIPTION OF THE DRAWINGS

The present invention can be more fully understood by the subsequent detailed description and examples with reference made to the accompanying drawings, wherein:

FIG. 5a is a circuit diagram of the power insulator shown in the FIG. 4a;

DETAILED DESCRIPTION OF THE INVENTION

Figure 3:
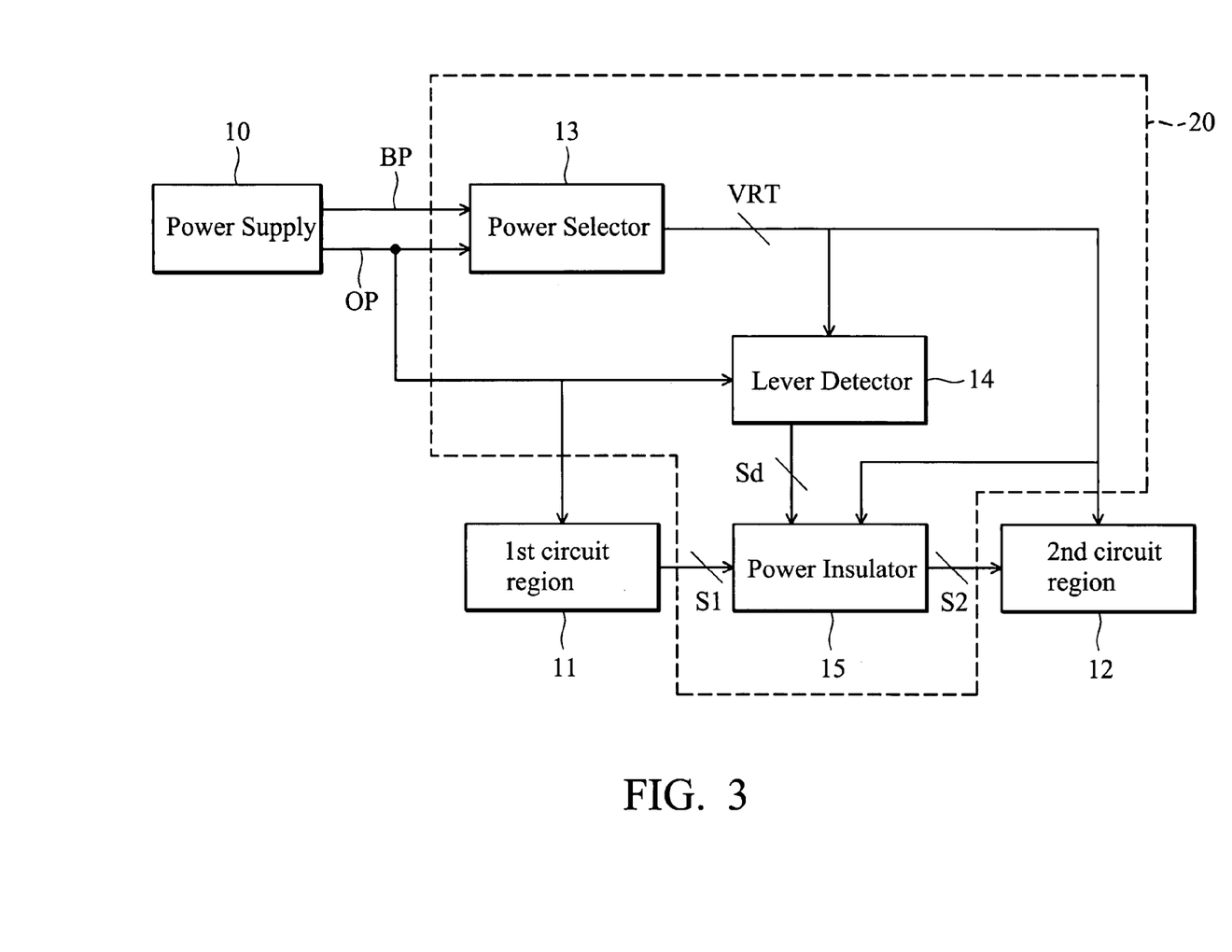
FIG. 3 is a block diagram of the insulating device for system on chip according to the present invention.

FIG. 3 is a block diagram of an insulating device for a system on chip according to the present invention. In FIG. 3, the power supply 10 includes a battery and a main power source OP. The insulating device 20 has a power selector 13, a level detector 14 and a power insulator 15. For example, the system on chip may have a first circuit region 11 powered by a main power source OP and a second circuit region 12 powered by a real-time power source VRT.

As shown in FIG. 3, the power supply provides a main power source OP, such as voltage source VCC, and a battery source BP to the power selector 13, with the first circuit 11 powered by the main power source. The power selector 13 designates the main power source OP or the battery source BP as a real-time power VRT to output to the second circuit region 12, the level detector 14 and the power insulator 15. Thus, the second circuit region 12, the level detector 14 and the power insulator 15 are powered by the real-time power source RTC.

For example, in a normal operating mode, the power selector 13 designates the main power source OP as the real-time power source VRT. Thus, at this time, the first circuit region 11, the second circuit region 12, the level detector 14 and the power insulator 15 are all powered by the main power source OP. In a power-down mode, however, the main power source OP is turned off, and power selector 13 designates the battery source BP as the real-time power VRT. Thus, at this time, the second circuit 12, the level detector 14 and the power insulator 15 are powered by the battery source BP, and the first circuit 11 is not powered.

The level detector 14 is powered by the real-time power source VRT to detect the voltage level of the main power source OP, and then outputs a result signal Sd. In the present invention, the level detector 14 outputs a result signal Sd of a first logic level when the voltage level of the main power source OP is low, and outputs a result signal Sd of a second logic level when the voltage level of the main power source OP is high. Thus, the result signal Sd is at the first logic level when the main power source is turned off in the power-down mode, and the result signal Sd is at the second logic level when the main power source OP is turned on in normal operating mode.

The power insulator 15 is coupled to the first circuit region 11 and the level detector 14 to produce a logic output S2 according to the result signal Sd and the output signal S1 of the first circuit region 11. In the present invention, the power insulator 15 can be a single logic gate or a combination of logic gates, such as a NAND gate, a NOR gate, an AND gate, an OR gate, an inversion gate and the like.

Figure 4A:
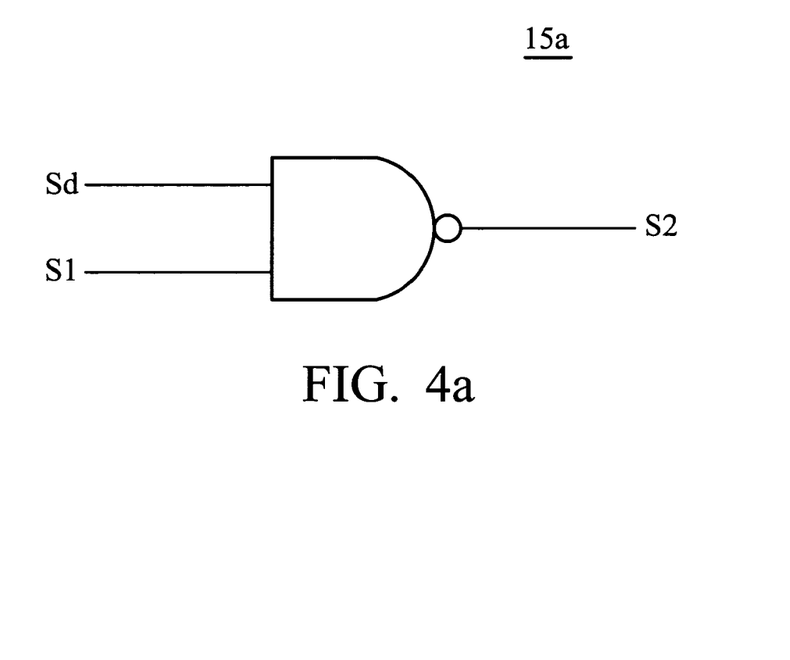
FIG. 4a shows a power insulator for the insulating device according to the present invention.

In the present invention, the power insulator 15 is a NAND gate as shown in FIG. 4a. The NAND gate has two input terminals coupled to the result signal Sd from the level detector 14 and the output signal from the first circuit region 11 respectively, and an output terminal outputting a logic output S2 to the second circuit region 12.

In this case, when the voltage level of the main power source OP is low, if the level detector 14 is designed to output a resulting signal Sd of a first logic level, such as logic low, the resulting signal Sd of low logic dominates the NAND gate 15a to output a high logic output regardless of the output signal from the first circuit region 11. When the voltage level of the main power source OP is high, if the level detector 14 is designed to output a resulting signal Sd of the second logic level, such as logic high, the logic output of the NAND gate 15a is determined by the output signal S1 from the first circuit 11. Therefore, the present invention can set the logic output of the power insulator 15 at a high logic level to prevent occurrence of current leakage caused by floating when the main power source OP is turned off in power-down mode.

Figure 5A:
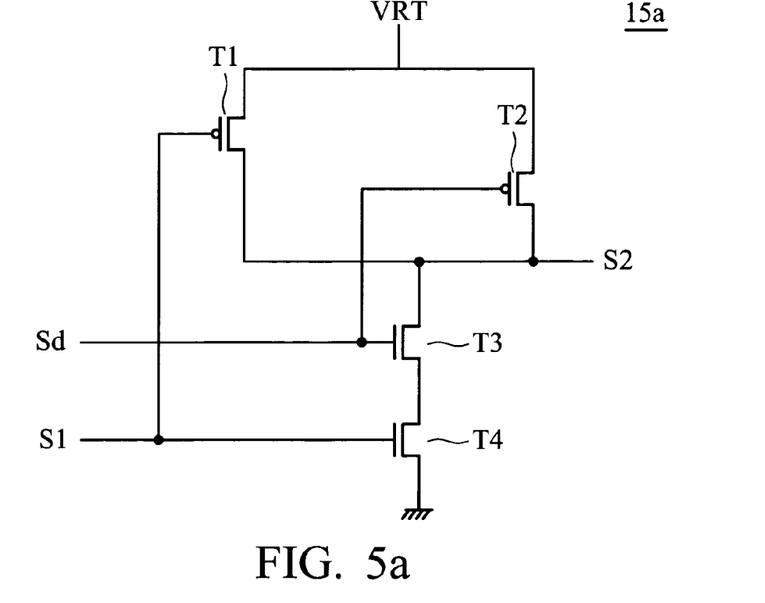
Figure 5B:
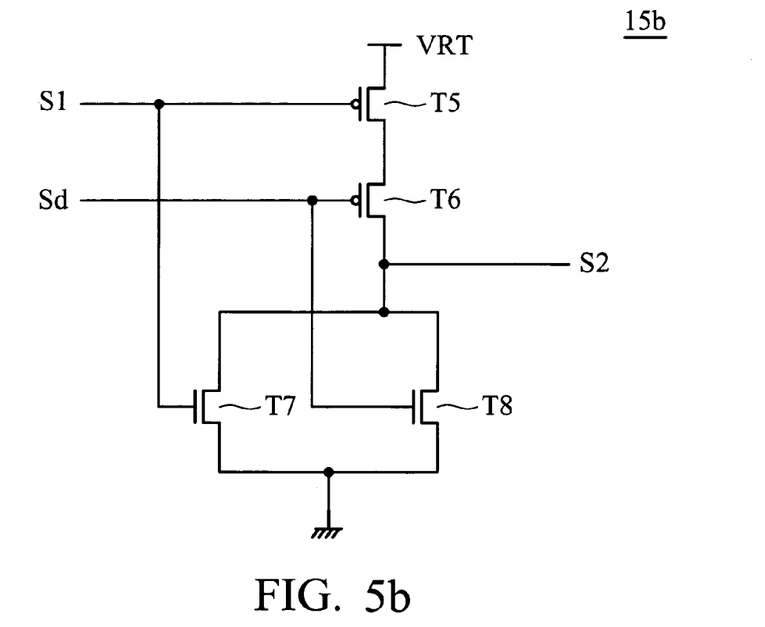
FIG. 5b is a circuit diagram of the power insulator shown in the FIG. 4b.

In this case, the NAND gate in the present invention can be implemented by four MOS transistors as shown in FIG. 5a. In FIG. 5a, the NAND gate 15a includes two PMOS transistors T1 and T2 and two NMOS transistors T3 and T4. It is noted that, the gates of the PMOS transistor T1 and NMOS transistor T4 are connected directly to the output signal S1 of the first circuit 11 without any buffers. The gate of the PMOS transistor T2 and the NMOS transistor T3 are connected directly to the resulting signal Sd from the level detector 14 without any buffers. The NMOS transistor T4 has a gate coupled to the output signal S1 of the first circuit region 11 and a source coupled to ground. The NMOS transistor T3 has a gate coupled to the resulting signal Sd and a source coupled to the drain of the NMOS transistor T4 and a drain as an output terminal. The PMOS transistor T1 has a gate coupled to the gate of the NMOS transistor T4, a source coupled to the high voltage, such as real-time power source, and a drain coupled to the drain of the NMOS transistor N3. The PMOS transistor T2 has a gate coupled to the gate of the NMOS transistor T3, a source coupled to the high voltage, such as real-time power source, and a drain coupled to the drain of the NMOS transistor T3.

When the voltage level of the main power source OP is low, if the level detector 14 is designed to output a result signal Sd of logic low, the PMOS transistor T2 is turned on and the NMOS transistor T3 is turned off. Thus, the NAND gate 15a outputs a high logic output S2 to the second circuit 12 regardless of the state of MOS transistors T1 and T4. On the contrary, when the voltage level of the main power source OP is high, if the level detector 14 is designed to output a resulting signal Sd of logic high, the PMOS transistor T2 is turned off and the NMOS transistor T3 turned on. Thus, the logic output S2 of the NAND gate 15a is determined according to turning on of the MOS transistors T1 and T4 being controlled by the output signal S1 from the first circuit region 11. Thus, the present invention can set the logic output of the power insulator 15 at a high logic level to prevent occurrence of current leakage caused by floating when the main power source OP is turned off in power-down mode.

Figure 4B:
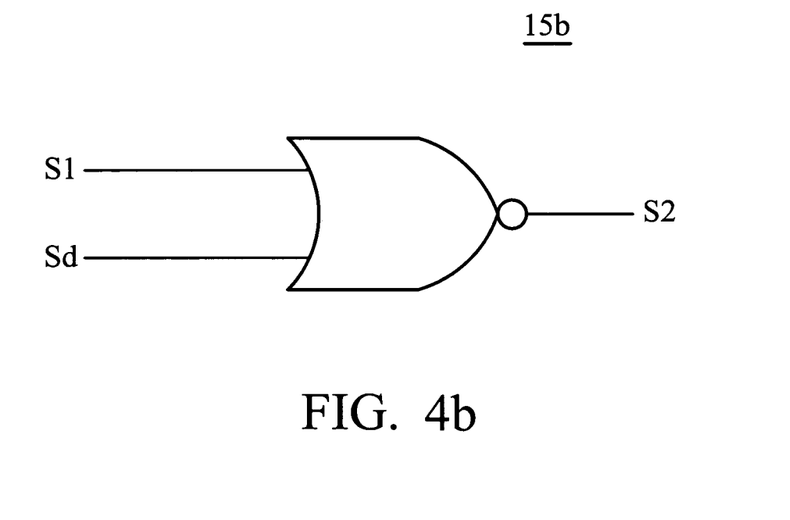
FIG. 4b shows another power insulator for the insulating device according to the present invention.

In addition, in the present invention, the power insulator can be a NOR gate as shown in FIG. 4b. The NOR gate 15b has two input terminals coupled to the resulting signal Sd from the level detector 14 and the output signal S1 from the first circuit region 11 respectively, and an output terminal to output a logic output S2 to the second circuit region 12.

In this case, when the voltage level of the main power source OP is low, if the level detector 14 is designed to outputs a resulting signal Sd of a first logic level, such as logic high, the resulting signal Sd of high logic dominates the NOR gate 15b to output a low logic output regardless of the output signal from the first circuit region 11. On the contrary, when the voltage level of the main power source OP is high, if the level detector 14 is designed to output a resulting signal Sd of the second logic level, such as logic low, the logic output of the NOR gate 15b is determined by the output signal S1 from the first circuit region 11. Thus, the present invention can set the logic output of the power insulator 15 at a low logic level to prevent occurrence of current leakage caused by floating when the main power source OP is turned off in power-down mode.

In this case, the NOR gate 15b can be implemented by four MOS transistors T5–T8 as shown in FIG. 5a. When the voltage level of the main power source OP is low, if the level detector 14 is designed to output a resulting signal Sd of logic high, the PMOS transistor T6 is turned off and the NMOS transistor T8 is turned on. Thus, the NAND gate 15b outputs a low logic output S2 to the second circuit 12 regardless of the state of MOS transistors T5 and T7. On the contrary, when the voltage level of the main power source OP is high, if the level detector 14 is designed to output a resulting signal Sd of logic low, the PMOS transistor T6 is turned on and the NMOS transistor T8 turned off. Thus, the logic output S2 of the NOR gate 15b is determined according to the state of MOS transistors T5 and T7 being controlled by the output signal S1 from the first circuit region 11. Therefore, the present invention can set the logic output of the power insulator 15 at a low logic level to prevent occurrence of current leakage caused by floating when the main power source OP is turned off in power-down mode.

Figure 4C:
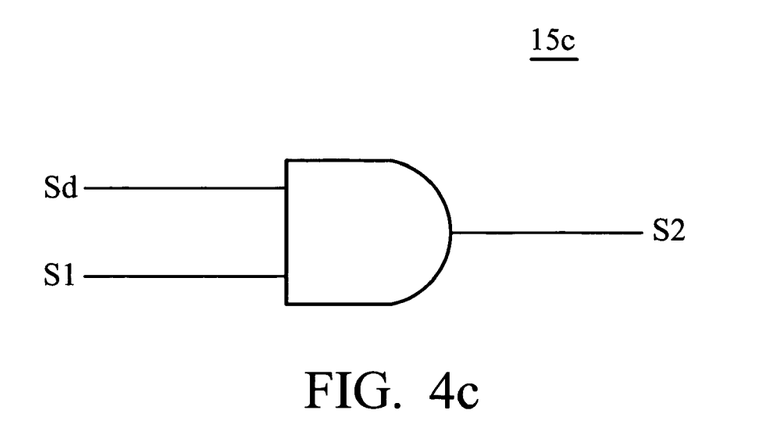
FIG. 4c shows another power insulator for the insulating device according to the present invention.
Figure 4D:
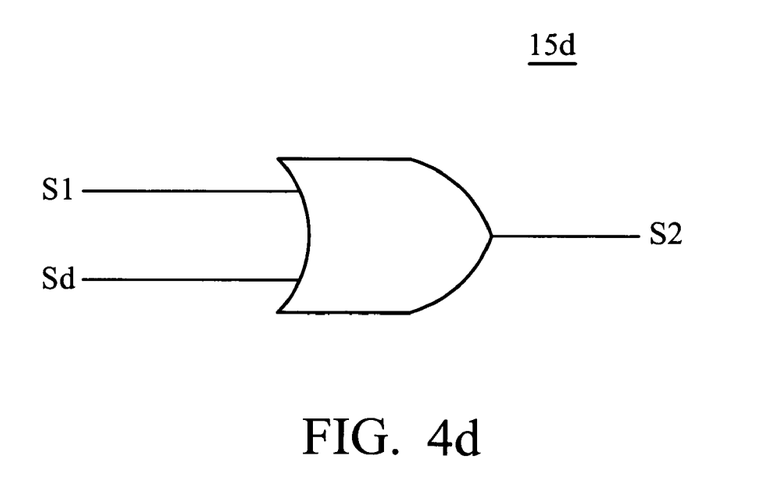
FIG. 4d shows another power insulator for the insulating device according to the present invention.
Figure 4E:
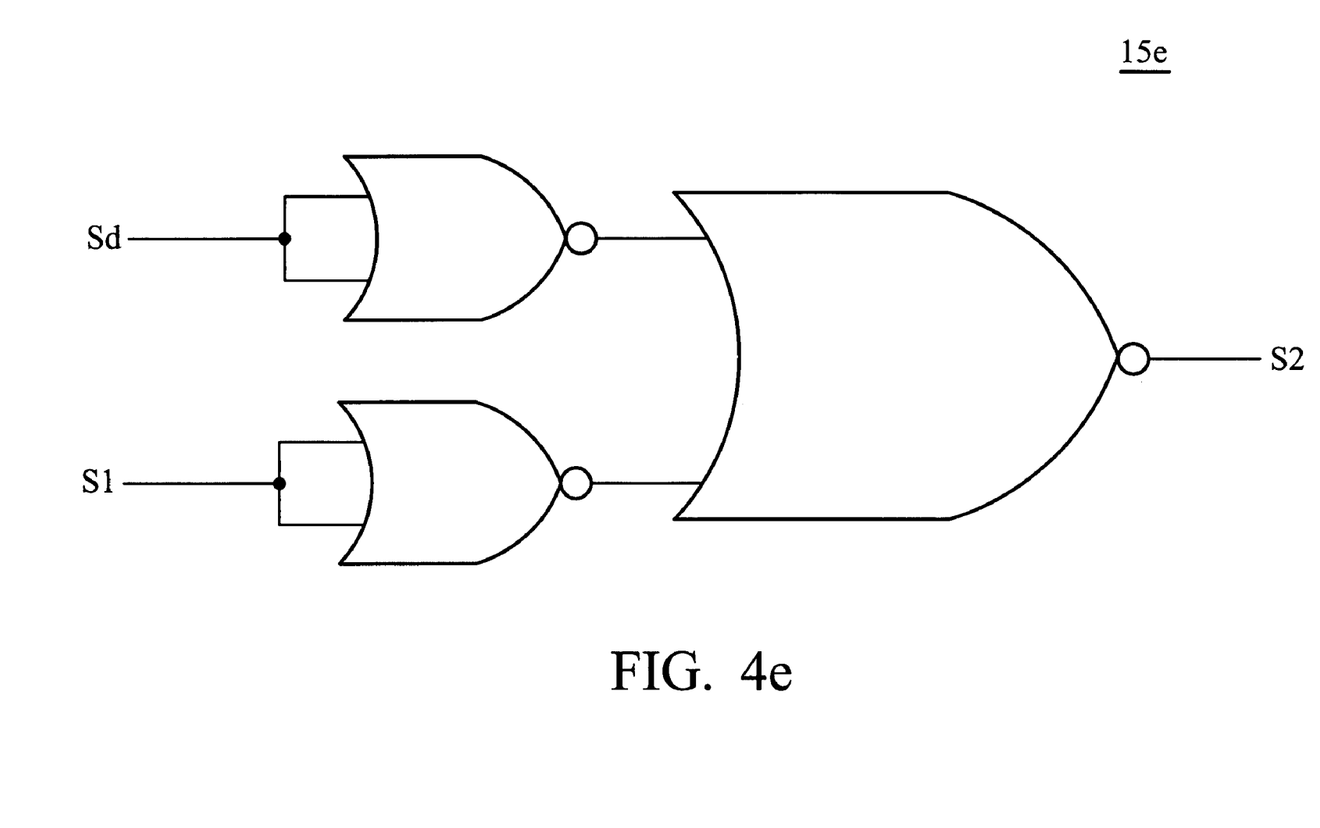
FIG. 4e shows another power insulator for the insulating device according to the present invention.
Figure 5C:
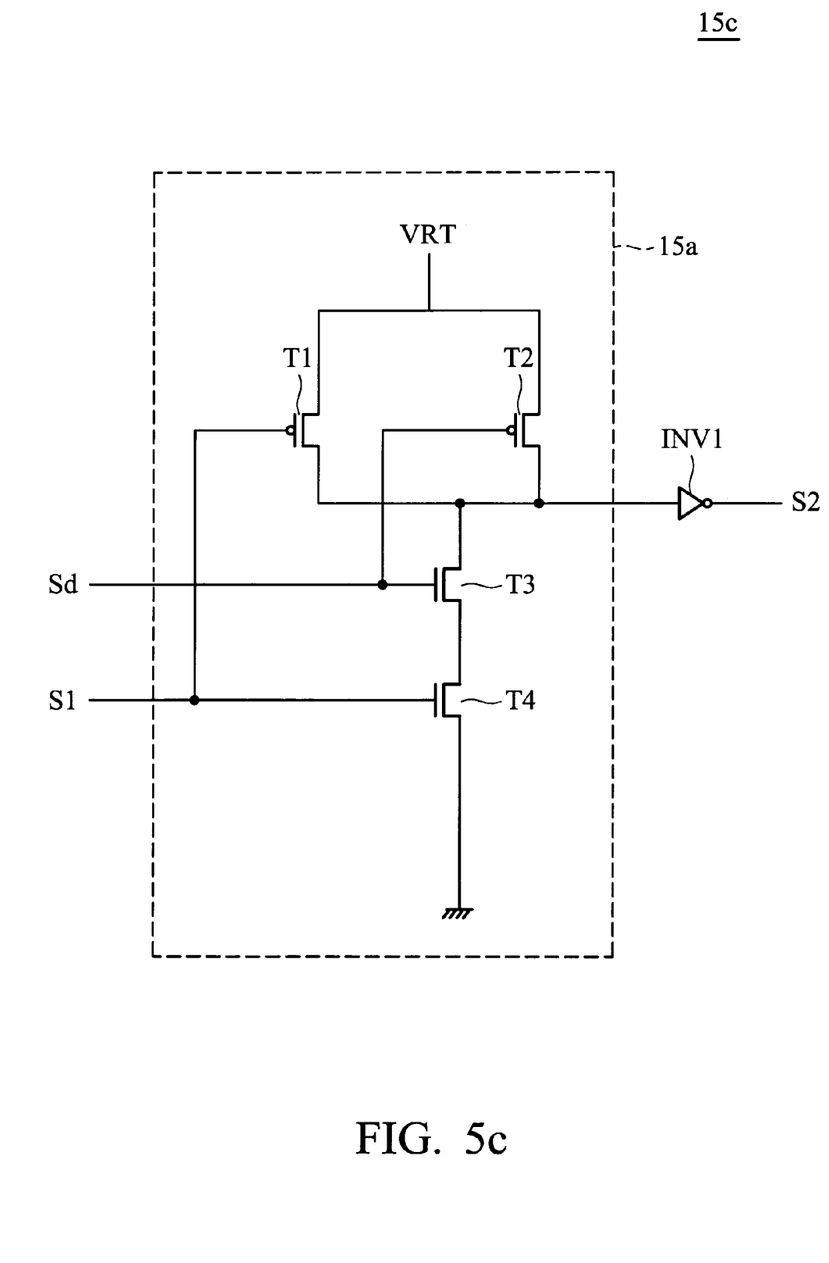
FIG. 5c is a circuit diagram of the power insulator shown in the FIG. 4c.

Furthermore, the power insulator 15 is also can be an AND gate as shown in FIGS. 4c and 4e. In the present invention, the AND gate 15c can be implemented by a NAND gate 15a and an inversion gate INV1 as shown in FIG. 5c. The logic output of the NAND gate 15a is inverted by the inversion gate INV1, and then output to the second circuit region 12.

In this case, when the voltage level of the main power source OP is low, if the level detector 14 is designed to output a resulting signal Sd of logic low, the resulting signal Sd of low logic dominates the AND gate 15c to output a low logic output S2 regardless of the output signal S1 from the first circuit region 11. On the contrary, when the voltage level of the main power source OP is high, if the level detector 14 is designed to output a resulting signal Sd of logic high, the logic output S2 of the AND gate 15c is determined by the output signal S1 from the first circuit region 11.

Figure 5D:
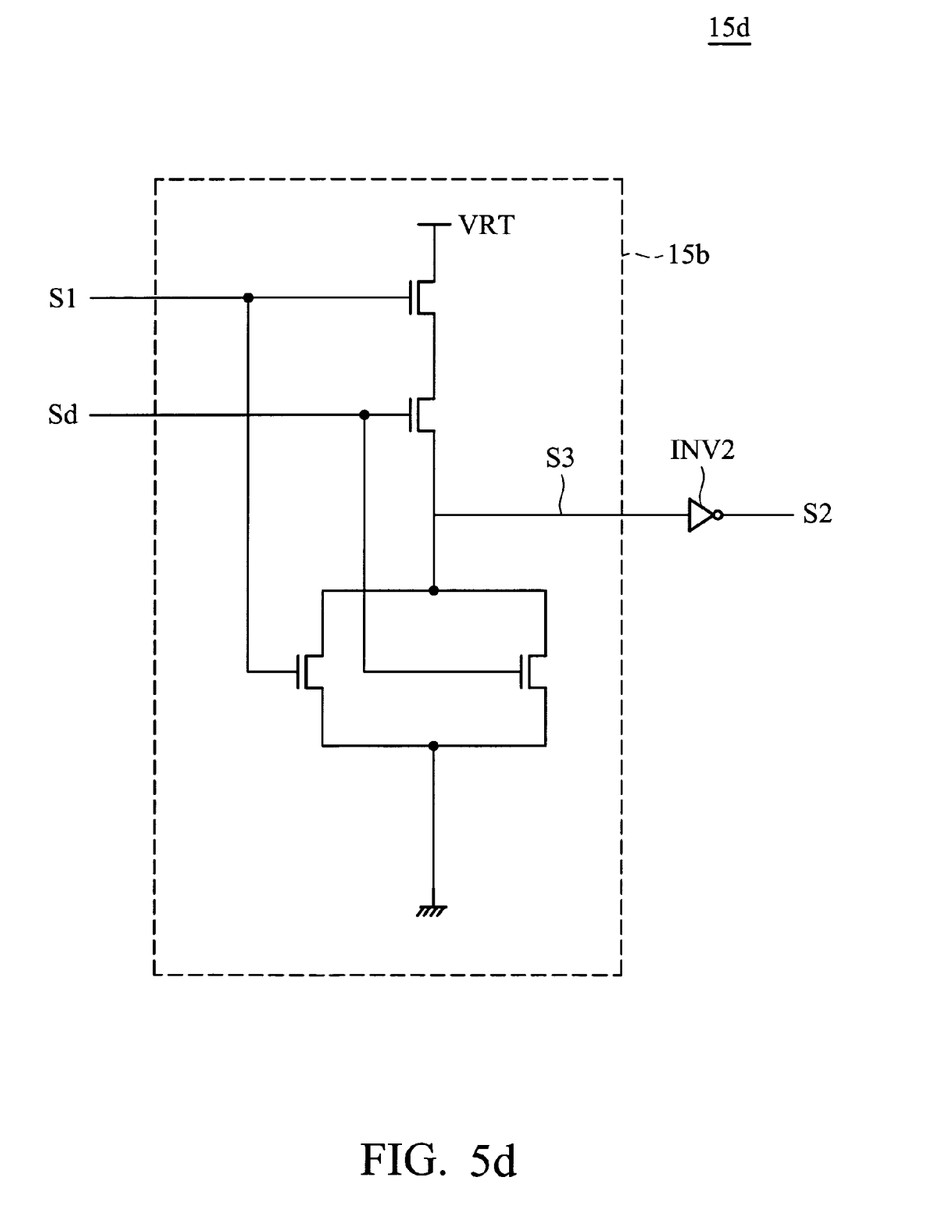
FIG. 5d is a circuit diagram of the power insulator shown in the FIG. 4d.

Moreover, the power insulator 15 can also be an OR gate as shown in FIG. 4d. In this case, the OR gate 15d can be implemented by a NOR gate 15b and an inversion gate INV2 as shown in FIG. 5d. The logic output of the NOR gate 15b is inverted by the inversion gate INV2, and then output to the second circuit region 12.

In this case, when the voltage level of the main power source OP is low, if the level detector 14 is designed to output a resulting signal Sd of logic high, the resulting signal Sd of high logic dominates the OR gate 15d to output a high logic output S2 regardless of the output signal S1 from the first circuit region 11. On the contrary, when the voltage level of the main power source OP is high, if the level detector 14 is designed to output a result signal Sd of logic low, the logic output S2 of the OR gate 15d is determined by the output signal S1 from the first circuit region 11.

In the present invention, the logic output of the power insulator can be set at a low logic level or high logic level to prevent occurrence of current leakage caused by floating when the main power source is turned off in power-down mode. Therefore, the present invention can improve the power utilization of the whole system without using tri-state devices, and is accommodating to timing analysis.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An insulating device for system on chip (SOC), wherein the SOC has a first circuit region powered by a main power source and a second circuit region powered by a real-time power source, comprising:
    a selector designating the main power source or a battery source as the real-time power source;
    a level detector powered by operating power source to detect a voltage level of the main power source and output a resulting signal;
    a NAND gate coupled to the first circuit and the level detector to produce a logic output according to the resulting signal and an output signal of the first circuit, wherein the NAND gate comprises:
        a first NMOS transistor having a gate coupled to the output signal of the first circuit, and a source coupled to ground and a drain;
        a second NMOS transistor having a gate coupled to the result signal, a source coupled to the drain of the first NMOS transistor and a drain as an output terminal;
        a first PMOS transistor having a gate coupled to the gate of the first NMOS transistor, a source coupled the real-time power source and a drain coupled to the drain of the second NMOS transistor; and
        a second PMOS transistor having a gate coupled to the gate of the second NMOS transistor, a source coupled to the real-time power source and a drain coupled to the drain of the second NMOS transistor.

2. The insulating device as claimed in claim 1, further comprising an inversion gate having an input coupled to the drain of the second NMOS transistor to invert the logic output produced by the NAND gate.

3. The insulating device as claimed in claim 1, wherein, in normal operating mode, the main power source is designated as the real-time power source, such that the first circuit, the level detector and the power insulator are powered by the main power source.

4. The insulating device as claimed in claim 3, wherein, in power-down mode, the battery source is designated as the real-time power, and the first circuit is not powered by the main power source.

5. The insulating device as claimed in claim 4, wherein the resulting signal is connected to the gates of the first NMOS transistor and the first PMOS transistor without any buffer, and the output signal of the first circuit is connected to the gates of the second NMOS transistor and the second PMOS transistor without any buffer.

6. An insulating device for system on chip (SOC), wherein the SOC has a first circuit region powered by a main power source and a second circuit region powered by a real-time power source, comprising:
    a selector designating the main power source or a battery source as a real-time power source;
    a level detector powered by the real-time power source to detect a voltage level of the main power source and output a resulting signal;
    a NOR gate coupled to the first circuit and the level detector to produce a logic output according to the resulting signal and an output signal of the first circuit, wherein the NOR gate comprises:
        a first PMOS transistor having a gate coupled to the output signal of the first circuit, a source coupled to real-time power source and a drain;
        a second PMOS transistor having a gate coupled to the resulting signal, a source coupled to the real-time power source and a drain as an output terminal;
        a first NMOS transistor having a gate coupled to the gate of the first PMOS transistor, a source coupled to ground and a drain coupled to the drain of the second PMOS transistor; and
        a second NMOS transistor having a gate coupled to the gate of the second PMOS transistor, a source coupled to the ground and a drain coupled to the drain of the second PMOS transistor.

7. The insulating device as claimed in claim 6, further comprising an inversion gate having an input coupled to the drain of the second PMOS transistor to invert the logic output produced by the NOR gate.

8. The insulating device as claimed in claim 6, wherein, in normal operating mode, the main power source is designated as the real-time power, such that the first circuit, the level detector and the power insulator are powered by the main power source.

9. The insulating device as claimed in claim 6, wherein, in power-down mode, the battery source is designated as the real-time power source, and the first circuit is not powered by the main power source.

10. The a insulating device as claimed in claim 6, wherein the resulting signal is connected to the gates of the first NMOS transistor and the first PMOS transistor without through buffer, and the output signal of the first circuit is connected to the gates of the second NMOS transistor and the second PMOS transistor without any buffer.

* * * * *